(12) United States Patent
Manganaro et al.

(10) Patent No.: US 9,584,151 B1
(45) Date of Patent: Feb. 28, 2017

(54) RANDOMIZED QUAD SWITCHING

(71) Applicant: ANALOG DEVICES, INC., Norwood, MA (US)

(72) Inventors: Gabriele Manganaro, Winchester, MA (US); Gil Engel, Lexington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/058,008

(22) Filed: Mar. 1, 2016

(51) Int. Cl.
*H03M 1/66* (2006.01)

(52) U.S. Cl.
CPC ..................... *H03M 1/66* (2013.01)

(58) Field of Classification Search
CPC ...... H03M 1/0673; H03M 1/66; H03M 1/747; H03M 3/464; H03M 1/687; H03M 1/1057; H03M 1/0607; H03M 1/0648; H03M 1/0863
USPC ........................................ 341/144, 136, 153
See application file for complete search history.

(56) References Cited

U.S. PATENT DOCUMENTS

| | | | | |
|---|---|---|---|---|
| 5,815,103 A * | 9/1998 | Comminges | .......... | H03M 1/745 341/136 |
| 6,275,179 B1 * | 8/2001 | Mori | ..................... | H03M 1/068 341/144 |
| 6,407,688 B1 * | 6/2002 | Greig | .................. | H03M 1/0604 323/315 |
| 9,450,599 B1 * | 9/2016 | Kwon | ..................... | H03M 1/66 |
| 2003/0043062 A1 * | 3/2003 | Dedic | ................. | H03M 1/0881 341/144 |
| 2004/0246155 A1 * | 12/2004 | Huang | ................ | H03M 1/0673 341/141 |
| 2005/0168365 A1 * | 8/2005 | Kaplan | ............... | H03M 1/0665 341/143 |
| 2011/0279292 A1 * | 11/2011 | Parida | ..................... | H03M 7/12 341/62 |
| 2013/0015993 A1 * | 1/2013 | Santos | ................ | H03M 1/0624 341/144 |
| 2015/0048961 A1 * | 2/2015 | Schafferer | ............ | H03M 1/747 341/145 |

OTHER PUBLICATIONS

Bernd Schafferer et al., *20.1—A 3V CMOS 400mW 14b 1.4GS/s DAC for Multi-Carrier Applications*, ISSCC 2004 / Session 20 / Digital-to-Analog Converters / 20.1, Analog Devices, Wilmington, MA © 2004 IEEE International Solid-State Circuits Conference, 10 pages.

(Continued)

*Primary Examiner* — Linh Nguyen
(74) *Attorney, Agent, or Firm* — Patent Capital Group

(57) ABSTRACT

Reducing distortions in a digital-to-analog converter is a challenge for circuit designers. For current steering digital-to-analog converters (DACs), a quad switching scheme has been used to remove code-dependent glitching which is otherwise present in dual switching schemes. However, due to various impairments in the circuit, e.g., mismatches in the transistors, some code-dependent distortions remain even when a quad switching scheme is implemented. To address this issue, the quad switching scheme can be randomized to improve dynamic linearity while relaxing driving circuitry design and power constraints. Advantageously, randomization reduces the code dependency of the distortions and makes the distortions appear more noise-like at the output of the DAC.

20 Claims, 6 Drawing Sheets

(56) References Cited

OTHER PUBLICATIONS

Seonggeon Kim et al., *A 12 bit 250 MS/s mW +70 dB SFDR DAC in 0.11 μm CMOS Using Controllable RZ Window for Wireless SoC Integration*, IEEE Asian Solid-State Circuits Conference, Nov. 10-12, 2014/Kaohsiung, Taiwan, 978-1-4799-4089-9/14 © 2014 IEEE, 4 pages.
*AD9119/AD9129, 11-/14-Bit, 5.7 GSPS, RF Digital-to-Analog Converter*, Data Sheet, © 2013 Analog Devices, Inc. www.analog.com, 68 pages.
Douglas A. Mercer, *Current Steering Digital-to-Analog Converters*, 1 Digital-to-Analog Converter Basics, retrieved from the internet on Feb. 17, 2016: www.wiki.analog.com.university/courses/tutorials/cmos-dac-chapter, 19 pages.
Benjamin Jankunas, *Design and Calibration of a 12-Bit Current-Sterring DAC Using Data-Interleaving*, Theisis, Arizona State University, Dec. 2014, 71 pages.
Maliang Liu et al., *A High-SFDR 14-bit 500 MS/s Current-Steering D/A Converter in 0.18 μm CMOS*, IEEE Transactions on Very Large Scale Integration (VLSI) Systems, vol. 23, No. 12, Dec. 2015, 5 pages.
Weining Ni et al., *A 12-bit 300 MHz CMOS DAC for High-speed System Applications*, 0-7803-9390-2006 © 2006 IEEE, 4 pages.
Wei-Hsin Tseng et al., *A 12-bit 1.25-GS/s DAC in 90 nm CMOS With >70 dB SFDR up to 500 MHz*, IEEE Journal of Solid-State Circuits, vol. 46, No. 12, Dec. 2011, 0018-9200 © 2011 IEEE, 12 pages.
Wei-Hsin Tseng et al., *A CMOS 8-Bit 1.6 GS/s DAC With Digital Random Return-to-Zero*, IEEE Transactions on Circuits and Systems—II: Express Briefs, vol. 58, No. 1, Jan. 2001, 1549-7747 © 2010 IEEE, 5 pages.
Li Xueqing et al., *A 14-bit 250-MS/s current-steering CMOS digital-to-analog converter*, Journal of Semiconductors, vol. 34, No. 8, Aug. 2013, 85013-1 © 2013 Chinese Institute of Electronics, 7 pages.

\* cited by examiner

RANDOMIZED QUAD SWITCHING

TECHNICAL FIELD OF THE DISCLOSURE

The present invention relates to the field of integrated circuits, in particular to randomized quad switching for current steering digital-to-analog converters.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs are used to drive a variety of devices. Loudspeakers, video displays, motors, mechanical servos, radio frequency (RF) transmitters, and temperature controls are just a few examples. DACs are often incorporated into digital systems in which real-world signals are digitized by analog-to-digital converters (ADCs), processed, and then converted back to analog form by DACs.

Present day digital circuit applications are becoming increasing sophisticated as the range of applications for these circuits increases. When signals are processed in the digital domain, the signal is often converted to the analog domain, e.g., for transmission, by a DAC. Many architectures exists for DACs, including delta-sigma DACs, R-2R DACs, String DACs, and current steering DACs. These architectures have varying advantages and disadvantages. For high-speed or high converter/sample rate applications, current steering DACs tend to be the best among the different architectures. Current steering DACs, have been moving to higher and higher sample rates as companies push to achieve high instantaneous bandwidth. The requirement of instantaneous bandwidth comes with the additional requirement that dynamic performance should not be sacrificed relative to existing lower bandwidth, lower frequency solutions. For instance, it is desirable to reduce distortions in high speed current steering DACs, but to reduce distortions is not trivial.

SUMMARY OF THE DISCLOSURE

Reducing distortions in a digital-to-analog converter is a challenge for circuit designers. For current steering digital-to-analog converters (DACs), a quad switching scheme has been used to remove code-dependent glitching which is otherwise present in dual switching schemes. However, due to various impairments in the circuit, e.g., mismatches in the transistors, some code-dependent distortions remain even when a quad switching scheme is implemented. To address this issue, the quad switching scheme can be randomized to improve dynamic linearity while relaxing driving circuitry design and power constraints. Advantageously, randomization reduces the code dependency of the distortions and makes the distortions appear more noise-like at the output of the DAC.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Basics of Current Steering DACs

A DAC generally produces a quantized (discrete step) analog output in response to a digital input code (e.g., a binary digital input code). Current steering DACs typically operate by converting a digital input signal, e.g., a X-bit digital input signal, into a current which is an analog representation of the digital input signal. One exemplary way of providing the current output representative of the digital input signal is by providing and distributing bits or parts of the digital signal as driving codes to an array of properly sized current steering DAC cells. Each one of the current steering DAC cells provides an appropriately weighted current based on a respective driving code to the cell.

In a binary weighted DAC, one cell can be provided per bit of the digital input signal to the DAC, where each cell provides a binary weighted current output based on a respective bit of the digital input signal to the DAC. In some other architectures, unary weighted cells (receiving thermometer codes) are used instead of binary weighted cells. Regardless of the weight of the cells, current steering DAC cells are each typically implemented with a current source for generating an appropriate amount of current, and switch(es) for steering the current to the DAC output based on a corresponding part of the digital input signal.

Figure 1:
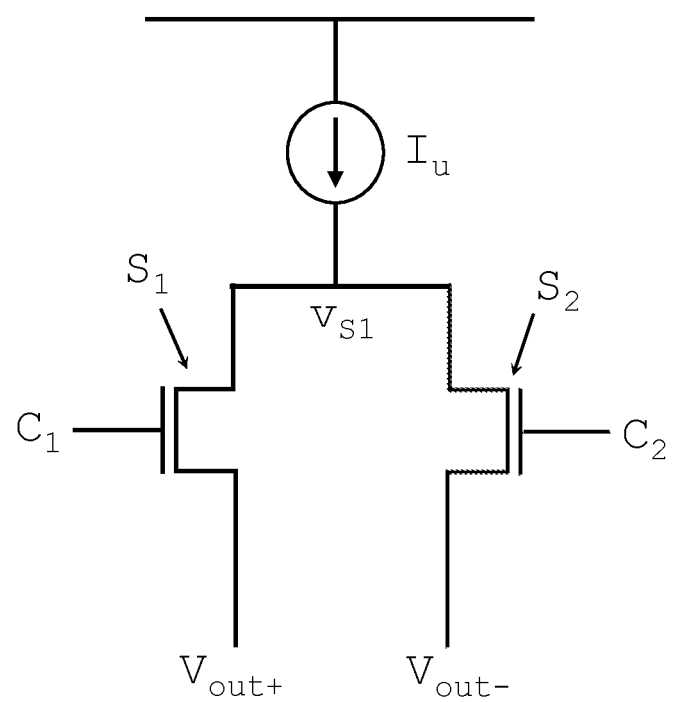
FIG. 1 is a current steering DAC cell having a dual switching scheme.

One common architecture for current steering DAC cells is the dual switching scheme, where each cell has a pair of switches, i.e., a differential pair, where the pair of switches steer tail currents towards a positive or negative output node as result of the binary state of a driving code. FIG. 1 is a current steering DAC cell having a dual switching scheme. The DAC cell has a current source generating a current $I_u$, and a pair of switches $S_1$ and $S_2$ serving as a differential pair. A driving code corresponding to the DAC cell (i.e., a digital code corresponding to the cell) can be generated based on the digital input code to the DAC. The driving code, in some examples, can have binary states (i.e., two states), and the driving code determines whether the current $I_u$ is to be steered towards the positive output node $V_{out+}$ or the negative output node $V_{out-}$. Based on the driving code, appropriate signals $C_1$ and $C_2$ driving (gates of) the pair of transistors $S_1$ and $S_2$ (serving as switches) are generated (e.g., by a cell decoder or cell decoding circuitry) to turn (exactly) one of the transistors $S_1$ and $S_2$ on, and the other one off. In the example of a dual switching scheme, signals $C_1$ and $C_2$ can be generated to provide an appropriate voltage at the gate of the transistors $S_1$ and $S_2$ respectively to turn on an appropriate one of transistors $S_1$ and $S_2$ to steer the current $I_u$ towards the positive output node $V_{out+}$ or the negative output node $V_{out-}$.

Herein, "transistor" and "switch" are used interchangeably for the current-steering switches of the DAC cell.

For example, suppose the driving code=1 indicating the current $I_u$ is to be steered towards the positive output node $V_{out+}$, and transistors $S_1$ and $S_2$ are p-type metal-oxide semiconductor field effect transistors (PMOS transistors). Signal $C_1$ can be lowered or pulled down (i.e., to sufficiently low voltage) to turn on transistor $S_1$, and signal $C_2$ can be raised or pulled up (i.e., sufficiently high voltage) to turn off transistor $S_2$. As a result, current $I_u$ is steered towards the positive output node $V_{out+}$. For the same example, when the driving code=0, indicating the current $I_u$ is to be steered towards the negative output node $V_{out+}$, signal $C_1$ can be raised or pulled up (i.e., to sufficiently high voltage) to turn off transistor $S_1$ and signal $C_2$ can be lowered or pulled down (i.e., sufficiently low voltage) to turn on transistor $S_2$. As a result, current $I_u$ is steered towards the negative output node $V_{out-}$.

The driving codes to a plurality of current steering cells are not always changing. Some driving codes may remain the same as other driving codes change. For the dual switching scheme, the pair of transistors remain in the same state if the driving code corresponding to the cell remains the same. When the driving code changes, meaning the direction of the current being steered by the switches changes, the voltage at the common source node $v_{S1}$ would exhibit a little jump or a glitch, which can cause output distortions. Furthermore, when transistor $S_1$ or $S_2$ is turned on (operating in saturation), an attenuated replica of $V_{out+}$ or $V_{out-}$ respectively leaks through and appears at the common mode node. The amplitude of the attenuated replica is related to the intrinsic gain of the transistor). When the voltage at the common source node $v_{S1}$ is affected by the attenuated replica, the current being delivered to either one of the positive or negative output nodes is also affected, thereby causing output distortions. These output distortions are highly code-dependent (or switching event dependent), which means that the distortion can appear in the band of interest, which can be very undesirable.

Quad Switching Scheme for High Performance Current Steering DACs

Figure 2:
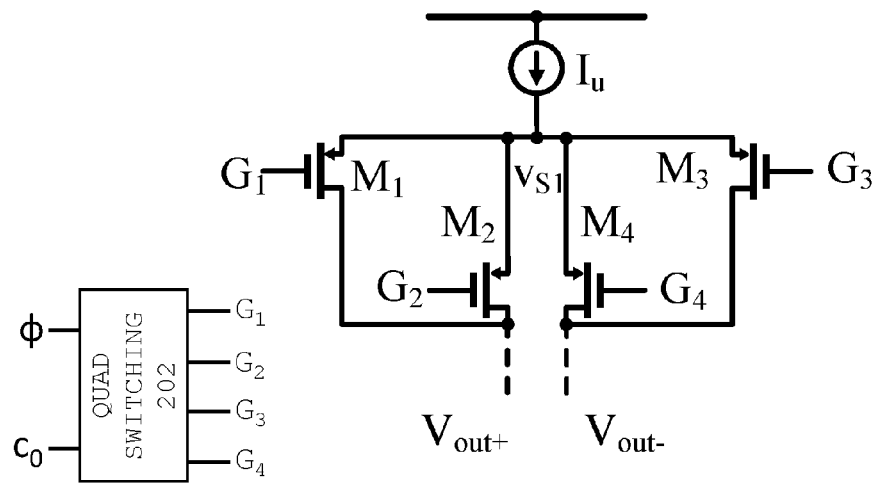
FIG. 2 is a current steering DAC cell having a quad switching scheme.

Output distortions are preferably reduced for better performance. To reduce the aforementioned output distortions present for the dual switching scheme, a quad switching scheme can be implemented. The quad switching scheme, involving a quad differential current switching configuration, ensures the glitching occurs every clock transition. As a result, the output distortions are less code-dependent. Output distortions would appear more white noise-like. FIG. 2 is a current steering DAC cell having a quad switching scheme. Similar to the dual switching scheme, the current steering DAC cell in FIG. 2 has a current source generating a current $I_u$. Instead of having two switches (e.g., $S_1$ and $S_2$ of FIG. 1), the quad switching current cell has four switches $M_1$, $M_2$, $M_3$, and $M_4$ (illustratively shown as PMOS transistors as an example) which share a (single) common source node $v_{S1}$. Switches $M_1$, $M_2$, $M_3$, and $M_4$ can be implemented with suitable metal-oxide semiconductor (MOS) transistors for steering the current $I_u$ towards either the positive output node $V_{out+}$ or the negative output node $V_{out-}$. The final direction of the current being steered towards the positive output node $V_{out+}$ or the negative output node $V_{out-}$ remains dependent on the driving code (shown as $c_0$). However, the additional switch for each side (positive or negative side) allows switching activity to occur every clock transition even when the driving code remains the same (i.e., current direction towards the positive output node $V_{out+}$ or the negative output node $V_{out-}$ remains the same). Quad switching logic 202 can be provided for the current steering DAC cell to implement the switching behavior by generating appropriate signals $G_1$, $G_2$, $G_3$, and $G_4$. The states of the switches $M_1$, $M_2$, $M_3$, and $M_4$ are controlled by signals $G_1$, $G_2$, $G_3$, and $G_4$ provided to the respective gates of the transistors.

For a given clock cycle, three of the switches would be off while one of the switch would be on. At every clock transition, one of the switches which was off would transition to turn on, and the switch which was on would transition to turn off. $M_1$ and $M_2$, can alternate being turned on when the current is to be steered towards $V_{out+}$, while $M_3$ and $M_4$ remains off. Likewise, $M_3$ and $M_4$, can alternate being turned on when the current is to be steered towards $V_{out-}$, while $M_1$ and $M_2$ remains off. Accordingly, each clock transition has switching activity, and the glitch would appear at the common source node $v_{S1}$ every clock transition, while the current is steered towards the correct or intended output node ($V_{out+}$ or $V_{out-}$).

Figure 3:
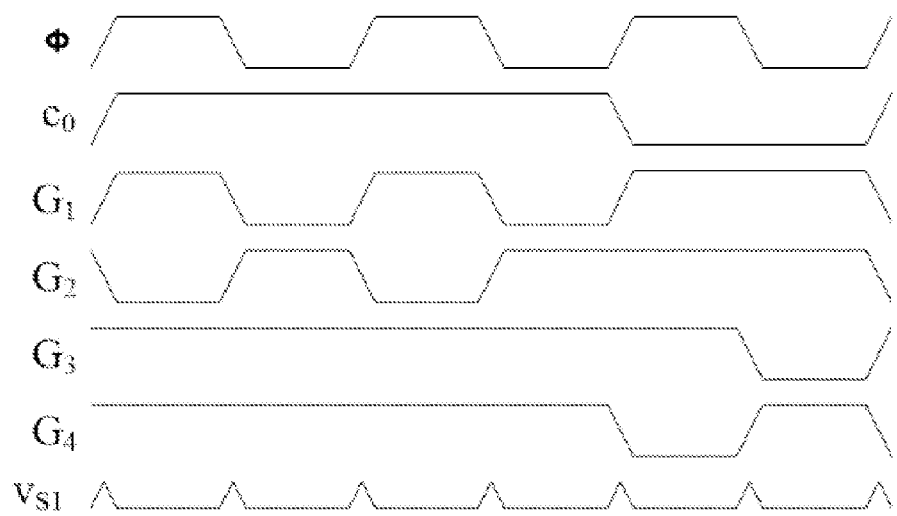
FIG. 3 shows illustrative waveforms of the quad switching scheme.

FIG. 3 shows illustrative waveforms of the quad switching scheme. As explained above, the four switches $M_1$, $M_2$, $M_3$, and $M_4$ are controlled by gate drive signals $G_1$, $G_2$, $G_3$, and $G_4$. $\phi$ is a clock signal at frequency $f_s$. $c_0$ is the driving code (e.g., a binary code) corresponding to a particular current steering DAC cell, indicating the intended direction of the current $I_u$ towards the output (e.g., either towards the positive output node $V_{out+}$ or the negative output node $V_{out-}$). For instance, if $c_0=1$, current goes towards $V_{out+}$. If $c_0=0$, current goes towards $V_{out-}$. At every clock transition (i.e., every half clock period) only one particular switch out of four can be turned on by, e.g., driving the gate of the particular switch low (while all other three gates are held up). As illustrated by the waveforms, if the driving code $c_0=1$, indicating $I_u$ needs to flow towards $V_{out+}$, then $M_1$ and $M_2$ are alternately turned on and off by lowering $G_1$ and $G_2$ in a ping-pong fashion (or alternating fashion) while $M_3$ and $M_4$ are both kept turned off by holding $G_3$ and $G_4$ up. When the driving code $c_0$ changes from 1 into 0, the role of the pair of switches $M_1$-$M_2$ swaps with $M_3$-$M_4$, so that $M_3$ and $M_4$ are alternatively be turned on and off by lowering $G_3$ and $G_4$ in a ping-pong fashion (or alternating fashion) while $M_1$ and $M_2$ stay turned off by holding $G_1$ and $G_2$ up. Effectively, the pair of transistors $M_1$-$M_2$ is responsible for steering the current $I_u$ to the positive output $V_{out+}$ while the pair of transistors $M_3$-$M_4$ steers the current $I_u$ to $V_{out-}$. The first pair of transistors $M_1$-$M_2$ ping-pongs for $c_0=1$, while the second pair of transistors $M_3$-$M_4$ ping-pongs for $c_0=0$. It can be seen from the waveform for the common source node $v_{S1}$ that a glitch appears at every clock transition (i.e., every half clock period), and the current $I_u$ is still going towards the intended output.

Deficiencies of the Quad Switching Scheme

Ideally, if all four MOS switches are perfectly equal (i.e., matched) and if all the waveforms driving their gates are also perfectly balanced and time-aligned as shown in FIG. 3, then the "glitching" waveform for the common source node voltage $v_{s1}$ will be periodic, i.e., with frequency $2f_s$ and data-independent (or code-independent). In other words, if all glitches are equal and if they all settle towards the very same quiescent state (as shown in FIG. 3, where the glitches settles to the same level between each glitch), then this waveform only has components at DC, $2f_s$, $4f_s$, . . . , $(2k)f_s$, . . . (k is a positive integer) and no components at a frequency dependent from the intended DAC output signal $V_{out}$. Phrased differently, there is no source of output signal distortion arising from the waveform $v_{s1}$. This scheme can effectively remove or significantly reduce the distortion arising from code-dependent glitching at $v_{s1}$ which otherwise occurs in traditional dual switching schemes illustrated in FIG. 1 by replacing it with a consistent and (ideally) code-independent glitching at every half clock cycle.

Figure 4:
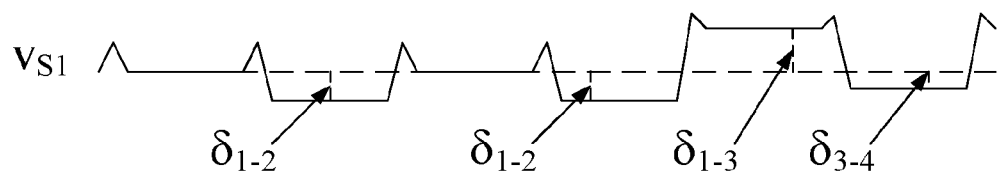
FIG. 4 illustrates code-dependent perturbations due to mismatches in the transistors.

In reality, however, due to a variety of impairments, $v_{s1}$ waveform having the glitches is not completely code-independent and hence residual distortion will still be introduced to the DAC's output $V_{out}$. For instance, if $M_1$, $M_2$, $M_3$ and $M_4$ have slightly different (mismatched) threshold voltages, $V_{Tj}=V_T+\Delta_j$ (for j=1, . . . , 4) then the waveform for $v_{s1}$ would look like the one shown in FIG. 4 instead. FIG. 4 illustrates code-dependent perturbations due to mismatches in the transistors. Ideally, the quad switching configuration works as a differential pair, where the "center point" $v_{S1}$ ideally has a constant quiescent point, or should return to the same level. When there is mismatch in the switches, swinging from one side to the other using mismatched switches would mean that the differential pair would no longer return to the same level. For instance, suppose there is a mismatch in threshold voltage between switches. Even though the current $I_u$, when one of the switches is on, is always the same, the gate to source voltage that will develop as a result of the current would be different because the threshold voltage is different. The center point is no longer the same, e.g., if the current is steered to the positive output $V_{out+}$ using one switch compared to if the current is steered to the negative output $V_{out-}$ using a different switch. Therefore, the steady state or quiescent point of $v_{S1}$ would not be the same every half clock cycle. One level of $v_{S1}$ can be different than the prior half clock cycle because the direction has changed and/or a switch having a different threshold voltage was turned on.

For example, when the current $I_u$ is being steered towards $V_{out+}$, and $M_1$ and $M_2$ are alternating. If $M_1$ and $M_2$ have different threshold voltages, when $M_1$ is on and $M_2$ is off, a certain source voltage appears at vsi. When transistors $M_1$ and $M_2$ swap, the gate to source voltage for $M_2$ is different because threshold voltage is different, therefore the quiescent point of $v_{S1}$ is different as well. The difference in quiescent points is determined by the difference in threshold voltages between $M_1$ and $M_2$. Suppose the direction of the current changes and the current is switched to steer towards $V_{out-}$. When $M_1$ turns off so that $M_3$ can turn on, mismatches in threshold voltages of $M_1$ and $M_3$ can also show up as having different levels in $v_{S1}$. Therefore, the varied quiescent points associated with mismatches can be code-dependent. The sequence in which the different levels appear depends on the driving code. The level of $v_{S1}$, having the varied quiescent points due to mismatches, can modulate the current source and affect the amount of current being steered towards the output. As a result, output distortions which are code-dependent appears at the output. It can be seen by observing the waveform in FIG. 4 that while a component at frequency $2f_s$ is still present, this waveform does not repeat itself identically at an integer multiple of the clock rate as the one shown in FIG. 3. Such mismatches introduce deviations $\delta_{k-m}$ to the quiescent voltage level of $v_{s1}$ compared to the previous code-independent waveform of $v_{s1}$ seen in FIG. 3. Furthermore, the order in which such series of deviations develops depends on the order on which the quad switch steers the current $I_u$ to the positive or negative outputs respectively.

Figure 5:
FIG. 5 illustrates code-dependent perturbations which appear when realistic switch drive waveforms and parasitics are taken into account.

Besides mismatches, the quad switching scheme has parasitics which can affect the waveform of $v_{S1}$. Usually, the waveform of $v_{S1}$ do not have flat portions shown in FIGS. 3 and 4. Rather, the waveform of $v_{S1}$ can take some time before the level settles between glitches (shown as "tails" due to slow settling of $v_{S1}$). FIG. 5 illustrates code-dependent perturbations which appear when realistic switch drive waveforms and parasitics are taken into account. Accounting for strays in the switches as well as in the circuits driving the switches, the waveform of $v_{S1}$ has curved portions illustrating yet another impairment which can cause undesirable output distortions, since the curved portions serve as yet another source of distortion where the waveform does not repeat itself identically at an integer multiple of the clock rate.

When periodic glitching at frequency $2f_s$ (occurring at every single half clock cycle, i.e., the quad switching scheme) combined with the above impairments (accounting for mismatches, parasitics, and realistic switch drive waveforms), code-dependent perturbation appears on $v_{s1}$ that could actually be potentially worse than if the switching would only occur as result of a code $c_0$ transition (i.e., the dual switching scheme). Nonlinear mixing between components at $(2k)f_s$ and the desired output signal introduce output distortion on the spectrum of $V_{out}$. While the quad switching can improve DAC linearity, some residual distortion due to the activity on $v_{S1}$ can actually resurface due to real circuit impairments.

Randomized Quad Switching Reduces Code-Dependent Distortions

To address some of the code-dependent components present in the waveform of $v_{S1}$, quad switching is randomized. Quad switching is implemented to ping-pong between the pair of switches $M_1$-$M_2$, and the pair of switches $M_3$-$M_4$. However, the ping-ponging skips from time to time, i.e., at random. Phrased differently, every once in a while, glitching is skipped. Instead of having the two switches swap every half clock cycle, two switches would not swap and no glitch would appear that would otherwise appear in the normal quad switching scheme. The direction of the current is still the one desired based on the driving code, so the behavior of the current steering cell is preserved. The result of skipping the periodic glitching from time to time is that the frequency of glitching is randomized. The distortion as a result of multiplying the code dependency with the constant $2f_s$ is broken. Instead of always alternatively turning off and on each switch of the two pairs ($M_1$-$M_2$ for steering current to the positive output $V_{out+}$, $M_3$-$M_4$ for the negative output $V_{out-}$), every once in a while, with random occurrence, a $M_1$-$M_2$ swap or a $M_3$-$M_4$ swap is skipped while the current direction remains as intended. While the distortion remains, but instead of having spurs mixed at $2f_s$, the spurs are mixed randomly between $f_s$ and $2f_s$, where the frequency modulation is jumping around randomly (between $2f_s$ and $f_s$). The spurs are spread over the noise floor. As a result, code-dependent output distortions appearing in the band of interest can be reduced.

Figure 6:
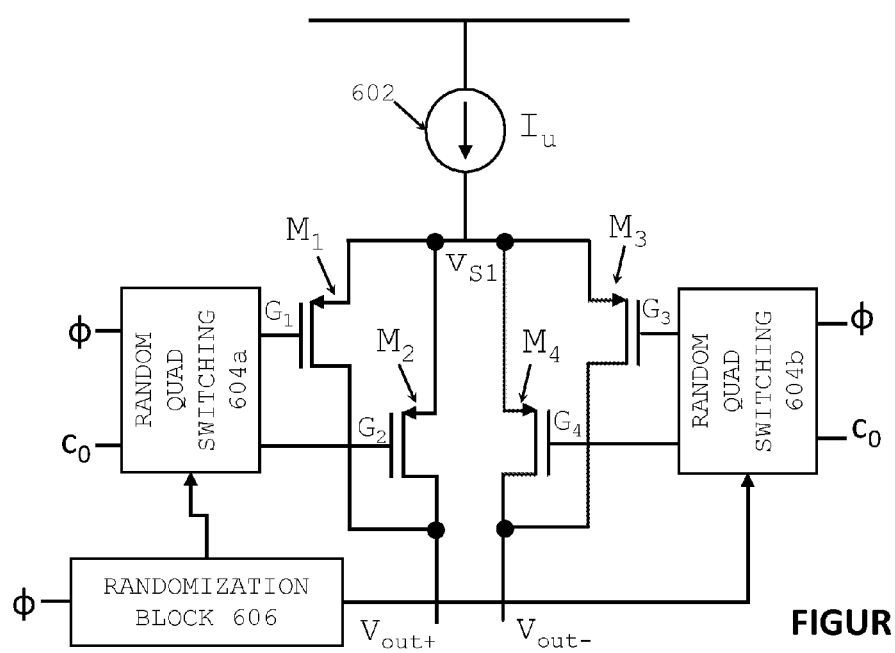
FIG. 6 shows a current steering DAC cell having a randomized quad switching scheme, according to some embodiments of the disclosure.

FIG. 6 shows a current steering DAC cell having a randomized quad switching scheme, according to some embodiments of the disclosure. The randomized quad switching scheme can reduce distortions by spreading the spurs over the noise floor and reducing distortions appear in the band of interest at the output. Similar to FIG. 2, the DAC cell has a current source 602 for generating a current $I_u$. In some implementations, the current source 602 can be implemented using transistors in cascade configuration. The DAC cell is coupled to or includes random quad switching logic (or circuitry) 604a-b. The random quad switching logic 604a-b implements the ping-pong behavior and skipping of the ping-ponging at random occurrence, wherein the skipping can be controlled or determined by a randomization block 606. The random quad switching logic 604a-b also ensures the current is steered in the intended direction based on the driving code $c_0$. Clock signal $\phi$ can be provided to both random quad switching logic 604a-b and randomization block 606 to ensure signals generated by either parts are synchronized to the clock signal $\phi$. Similar to, FIGS. 2-3, $\phi$ is a clock signal at frequency $f_s$. $c_0$ is the driving code (e.g., a binary code) corresponding to the particular current steering DAC cell, indicating the intended direction of the current $I_u$ towards the output (e.g., either towards the positive output node $V_{out+}$ or the negative output node $V_{out-}$).

The DAC cell of FIG. 6, similar to one in FIG. 2, includes four switches, which are implemented as four transistors: first, second, third, and fourth transistors (shown as $M_1$, $M_2$, $M_3$ and $M_4$ respectively). The first, the second, the third, and the fourth transistors are driven by first, second, third, and fourth signals respectively (shown as $G_1$, $G_2$, $G_3$, and $G_4$ respectively) for steering the current $I_u$ to a first output (shown as $V_{out+}$) or a second output ($V_{out-}$) of the current steering DAC cell depending on a driving code $c_0$ to the current steering DAC cell. All four transistors are coupled to the common source node $v_{S1}$. Two of the four transistors, $M_1$ and $M_2$, are coupled to the first output node $V_{out+}$; two other ones of the four transistors $M_3$ and $M_4$ are coupled to the second output node $V_{out-}$. Only one of the transistors are turned on at a time to steer the current to the intended output node (based on the driving code $c_0$).

The quad switching logic 604a-b can generate the first and the second signals ($G_1$ and $G_2$) which periodically alternate selecting one of the first and the second transistors ($M_1$ and $M_2$) to turn on and the other one of the first and the second transistors to turn off when the driving code is in a first state (e.g., $c_0=0$, indicating the current is to be steered towards $V_{out+}$). When the driving code is in the first state, the third and the fourth signals turns off the third and the fourth transistors. Likewise, the quad switching logic 604a-b can further generate the third and the fourth signals which periodically alternate selecting one of the third and the fourth transistors to turn on and the other one of the third and the fourth transistors to turn off when the driving code is in a second state (e.g., $c_0=1$, indicating the current is to be steered towards $V_{out-}$). When the driving code is in the second state, the first and the second signals turns off the first and the second transistors. The alternating selection of the pair of transistors $M_1$-$M_2$, or the pair of transistors $M_3$-$M_4$ occurs every half clock cycle (one period=one half clock cycle), or at frequency $2f_s$ (when the swapping is not being skipped randomly).

The randomization block 606, coupled to the quad switching logic 604a-b, can randomly maintain a same selection of the first and the second transistors for at least two consecutive periods (two consecutive periods=one full clock cycle) when the driving code is in the first state. The randomization block 606 can randomly maintain a same selection of the third and the fourth transistors for at least two consecutive periods when the driving code is in the second state. With random occurrence, the swapping or alternating of the pairs of transistors $M_1$-$M_2$ and $M_1$-$M_4$ (that is otherwise occurring every half clock cycle) is skipped. For a full clock cycle (or more), the same transistor as the previous half clock cycle is used (or turned on) for steering the current towards the desired output node for the next half clock cycle. In some embodiments, the quad switching logic 604a-b can include circuitry controlled by the randomization block 606 for randomly swapping states of the first and the second signals (e.g., swapping $G_1$, $G_2$ using a random swap network) to randomly maintain the same selection of the first and the second transistors. The quad switching logic 604a-b can include circuitry controlled by the randomization block 606 for randomly swapping states of the third and the fourth signals (e.g., swapping $G_3$, $G_4$ using a random swap network) to randomly maintain the same selection of the first and the second transistors (so that the periodic swapping every half clock cycle does not occur or is skipped).

The randomization block 606 can be implemented to generate a random series (e.g., randomized series of 1's and 0's having a particular probability distribution), or provide circuitry which can randomize the ping-ponging behavior (e.g., counter which changes counting cycle from N to 2N, counters having XOR (short for "exclusive OR" logic operation) circuitry with randomized periods/frequencies). In some embodiments, the randomization block 606 generates a random series of states to control whether (1) to alternate selecting one of the first and second transistors (swapping between $M_1$ or $M_2$) to turn on and the other one to turn off and (2) to randomly maintain the same selection. Likewise, the randomization block 606 can generate the random series of states to control whether (1) to alternate selecting one of the third and fourth transistors (swapping between $M_3$ or $M_4$) to turn on and the other one to turn off and (2) to randomly maintain the same selection. For some half clock periods, swapping occurs, and for some half clock periods (with random occurrence), swapping is skipped and the same transistor remains turned on for the next half clock period. Skipping swapping means switching activity no longer occurs every half clock period or consistently at $2f_s$, and glitching does not appear at $v_{S1}$ from time to time (i.e., for some half clock periods with random occurrence).

The quad switching logic 604a-b modulates code-dependent glitches at a node (i.e., common source node $v_{S1}$) connecting the current source to the first, the second, the third, and the fourth transistors ($M_1$, $M_2$, $M_3$ and $M_4$ respectively) with a component having a randomly varying frequency between a predetermined frequency (e.g., $f_s$) and twice of the predetermined frequency (e.g., $2f_s$). When swapping occurs, the glitches can be modulated by $2f_s$, and when swapping is skipped at random, the glitches can be modulated by $f_s$.

Figure 7:
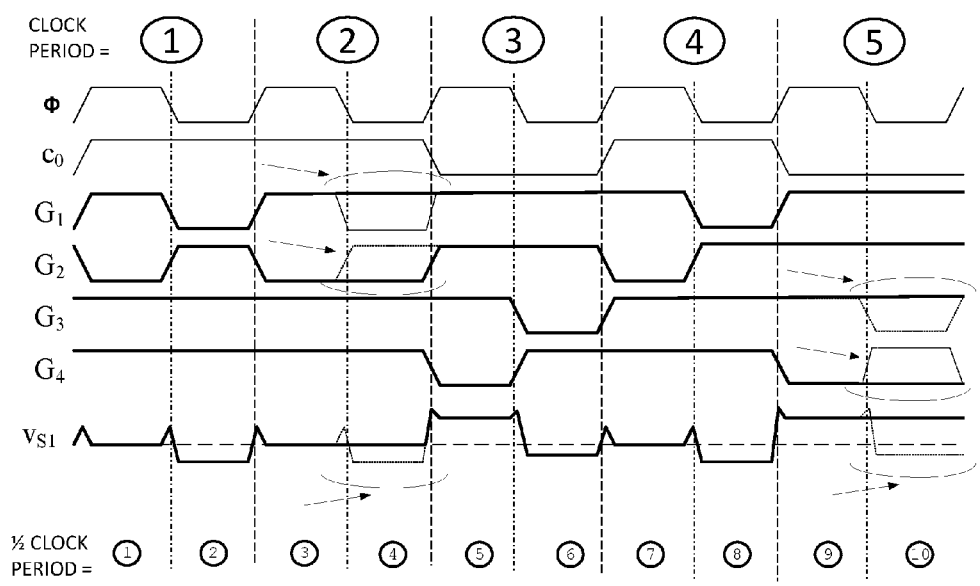
FIG. 7 shows illustrative waveforms of the randomized quad switching scheme, according to some embodiments of the disclosure.

FIG. 7 shows illustrative waveforms of the randomized quad switching scheme, according to some embodiments of the disclosure. The illustrative waveforms shows result of randomly skipping the alternating selection or transistors or swapping of transistor states. The random skipping can be referred herein as "swap skipping". Dotted line waveforms show what would have otherwise happened if the swap was occurring according to the traditional (non-randomized) quad switch scheme. To reduce cluttering of the waveforms, the tailing or slow settling of $v_{s1}$ caused by parasitics or other impairments (as seen in FIG. 5) is omitted without limiting the scope of the present disclosure. In this example, waveforms for five full clock periods/cycles (=ten half clock cycles/periods) are shown, where the driving code $c_0=1$ for the first, the second, and the fourth clock periods, and the driving code $c_0=0$ for the third and the fifth clock periods. The swap or ping-pong between $M_1$ and $M_2$ occurs regularly during the first clock period. One of the transistor is selected for one half of the first clock period; and the other transistor is selected for the other half of the first clock period. The glitch appears at $v_{S1}$ when swapping occurs, i.e., after the first half clock period, after the second half clock period. The swap or ping-pong between $M_1$ and $M_2$ is randomly skipped so that the frequency components modulating the glitching appearing at $v_{S1}$ is randomized. In this example, the swap or ping-pong between $M_1$ and $M_2$ does not occur during the second clock period. Swapping that was otherwise going to occur after the third half clock period is skipped. As result, the waveform of $v_{s1}$ is missing a glitch after the third half clock period and a level change (and any tail effect due to the slow settling time). Swapping occurs normally during the third and the fourth clock periods. Eventually, during the fifth clock period, the swap between $M_3$ and $M_4$ is also skipped (at random). As result, the waveform of $v_{s1}$ is missing yet another glitch after the ninth half clock period and yet another level change (and any tail effect due to the slow settling time).

Note that this "swap skipping" doesn't alter the direction of the current as determined by $c_0$. So the functionality of the steering pair is preserved. However, the shape of the $v_{s1}$ waveform is randomly changed as the code-dependent glitches (illustrated by FIGS. 4-5) are modulated with a component with frequency randomly varying in the interval between $2f_s$ and $f_s$, or between $2f_s$ and $f_s$. This effectively spreads the noise caused by the code-dependent glitches over a wide range of frequencies. By skipping the swapping randomly, $v_{s1}$ waveform is randomized by altering its periodicity and reducing the correlation between $v_{s1}$ and the code sequence $c_0$. Randomizing the period of the switching activity of $v_{s1}$ can cause the frequency of the corresponding products to also randomly vary their frequency. While there is still spurious content, the spurious content is no longer harmonically related to the output signal anymore but appears as a noise-like component. The harmonic distortion otherwise introduced by the traditional quad switching scheme is replaced by a moderate increase in noise spectral density when randomized quad switching is used. Randomized quad switching can considerably relax the need to design highly matched switches and very fast, very power-hungry, switch drivers (which were typically done to reduce the impairments illustrated in FIGS. 4-5). By relaxing the matching requirements on the switches and allowing for slower transition times, randomized quad switching allows designers to achieve reasonably good performance and overall lower power consumption by using smaller (more compact) steering units.

For full comparison, a classic dual switching pair as seen in FIG. 1 would only see glitches at code transitions (hence it is very code-dependent); a traditional quad switching pair as illustrated by FIGS. 2-3 sees glitches at every half clock period. Conversely, the random skip introduced randomized quad switching develops glitches randomly either at half clock period or at a full clock period (or longer), therefore the glitches (or switching activity) appear with a randomly hopping frequency between $f_s$ and $2f_s$. With the randomized quad switching scheme, the residual distortion that the traditional quad switching scheme was not able to completely remove due to impairments in switches and drivers is randomized and appears more as a white-noise-like component.

Randomizing the Selection of which Transistor to Use

Note that in the example of FIG. 7, if PMOS transistors are used to implement the switches, $G_2$ and $G_4$ first turn on $M_2$ and $M_4$ respectively on or just after the code transitions of $c_0$ (namely on the rising edge of clock $\phi$). Since either $M_1$ or $M_2$ can steer the current to the positive output node $V_{out+}$, and either $M_3$ or $M_4$ can steer the current to the negative output node $V_{out-}$, $M_1$ and $M_2$ are interchangeable and $M_3$ and $M_4$ are interchangeable. Further linearity improvement can be achieved by also randomizing the selection of the first switch to turn on upon code transition. For example, when $c_0$ goes from low to high, $M_1$ or $M_2$ can be randomly selected to be the first one to turn on. When $c_0$ goes from high to low, $M_3$ or $M_4$ could be randomly selected to be the first one to turn on. In some embodiments, the randomization block 606 can generate a random series of states to randomly select one of the first and the second transistors to turn on for a period immediately after the driving code changes from a second state to the first state. The randomization block 606 can also generate a random series of states to randomly select one of the third and the fourth transistors to turn on for a period immediately after the driving code changes from the first state to a second state.

Method for Randomized Quad Switching to Reduce Code-Dependent Distortions

Figure 8:
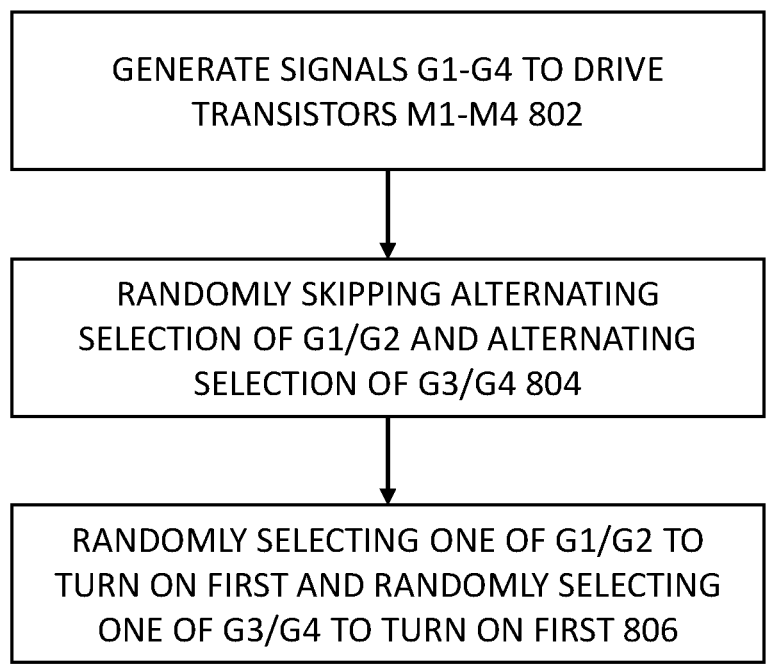
FIG. 8 shows a method for randomizing quad switching for a current steering DAC cell, according to some embodiments of the disclosure.

FIG. 8 shows a method for randomizing quad switching for a current steering DAC cell, according to some embodiments of the disclosure. The method is described with respect to illustrations in FIGS. 6-7.

In task 802, a random quad switching logic can generate, based on a driving code (e.g., $c_0$), first, second, third, and fourth signals (e.g., $G_1$, $G_2$, $G_3$, and $G_4$) to drive first, second, third, and fourth transistors (e.g., $M_1$, $M_2$, $M_3$, and $M_4$) respectively. The first and the second signals (e.g., $G_1$ and $G_2$ respectively) periodically alternate selection of the first or the second transistor ($M_1$ and $M_2$ respectively) to steer a current to a first output of the current steering DAC cell (e.g., $V_{out+}$) while the driving code is in a first state (e.g., $c_0=1$). For example, the first and the second transistors $M_1$ and $M_2$ are coupled to the positive output node $V_{out+}$. When the driving code $c_0=1$, and the current is intended to be steered towards $V_{out+}$, one of the transistors $M_1$ and $M_2$ is selected so that exactly one of the transistors is turned on to steer the current to $V_{out+}$, and the selection alternates periodically. The other transistors, i.e., the third and the fourth transistors are turned off. Likewise, the third and fourth signals (e.g., $G_3$ and $G_4$ respectively) periodically alternate selection of the third or the fourth transistor (e.g., $M_3$ and $M_4$ respectively) to steer the current to a second output of the current steering DAC cell (e.g., $V_{out-}$) while the driving code is in a second state (e.g., $c_0=0$). For example, the third and the fourth transistors $M_3$ and $M_4$ are coupled to the negative output node $V_{out-}$. When the driving code $c_0=0$, and the current is intended to be steered towards $V_{out-}$, one of the transistors $M_3$ and $M_4$ is selected so that exactly one of the transistors is turned on to steer the current to $V_{out-}$, and the selection alternates periodically. The other transistors, i.e., the first and the second transistors are turned off. At every half clock cycle, the selection swaps between the first and the second transistors $M_1$ and $M_2$, or the selection swaps between the third and the fourth transistors $M_3$ and $M_4$, and a glitch appears at a common source node (e.g., $v_{S1}$ of FIG. 6) connecting all of the first, the second, the third, and the fourth transistors (e.g., $M_1$, $M_2$, $M_3$, and $M_4$ respectively) to the current source (e.g., current source 602 of FIG. 6) every half clock cycle (when swapping is not randomly skipped).

In task 804, periodic alternating selection of the first and the second transistors $M_1$ and $M_2$ by the first and the second signals $G_1$ and $G_2$ is randomly skipped while the driving code is in the first state (e.g., $c_0=1$). Furthermore, periodic alternating selection of the third and the fourth transistors $M_3$ and $M_4$ by the third and the fourth signals $G_3$ and $G_4$ is randomly skipped while the driving code is in the second state (e.g., $c_0=0$). The randomized skipping of the periodic alternating selection of transistors in a pair of transistors can be implemented by a randomization block 606 seen in FIG. 6.

In some embodiments, the first and second signals $G_1$ and $G_2$ periodically alternate selection of the first or the second transistor $M_1$ and $M_2$ every half clock cycle while the driving code is in the first state (e.g., $c_0=1$). Two different transistors are turned on one after another during a full clock cycle due to the alternate selection of transistors, thereby causing a glitch to appear at the common source node $v_{S1}$. Periodic alternating selection of the transistors in the pair of transistors is skipped during a full clock cycle (e.g., second and fifth clock cycles seen in FIG. 7), where the same transistor is turned on for two consecutive half clock periods during a full clock cycle.

The first and second signals alternates turning one of the first and second transistors on and the other one of the first and the second transistors off every half clock cycle in response to the driving code being in the first state when random skipping of the periodic alternating selection is not occurring. The third and fourth signals alternates turning one of the third and fourth transistors on and the other one of the first and the second transistors off every half clock cycle in response to the driving code being in the second state when random skipping of the periodic alternating selection is not occurring. Randomly skipping periodic alternating selection means maintaining (the same) states of the first and second transistors for two or more consecutive periods (i.e., two or more half clock cycles) while the driving code is in a first state, and maintaining (the same) states of the third and fourth transistors for two or more consecutive periods i.e., two or more half clock cycles) while the driving code is in a second state.

In task 806, further linearity improvement can be achieved by randomly selecting one of the first and the second transistors to turn on for a period immediately after the driving code changes from a second state to the first state, and/or randomly selecting one of the third and the fourth transistors to turn on for a period immediately after the driving code changes from the first state to a second state. The randomized selection of a transistor in a pair of transistors coupled to the same output node can further randomize the distortion caused by mismatches between transistors.

Other Solutions are Ineffective

To reduce the above discussed source of distortion caused by the impairments, the switches and their drivers are designed so as the waveform shown in FIGS. 4-5 looks as close as possible to the one shown in FIG. 3. For example, smaller $\delta_{k-m}$'S are obtained by tighter switch matching. Faster decaying switching transients than those depicted in FIG. 5 are obtained through faster transition times in the drivers and by minimizing all parasitics associated with the switches and the signal path leading to them. Better matching in the switches is primarily achieved designing for large overdrive voltages ($V_{gs} \gg V_T$) in the switches. Faster transition times are obtained by using large switch drivers with low output impedance. Ironically such design strategies are conflicting with one another (e.g. better matching leads also to large physical device sizing and therefore large parasitics, hence aggravating the switch tailing in the waveforms of FIG. 5) and they all lead to large circuitry consuming large power (which problematic for low voltage, or low power designs). In turn, the latter triggers a "domino effect" of additional undesirable issues including considerably noisier supplies and substrate injection. By randomizing the quad switching scheme, it is possible to solve the mismatch problem without having to use large devices and consume lots of power. When smaller devices can be used, distortions due to parasitics can be reduced. Larger devices are no longer needed since distortion due to matching can be dealt with through randomization.

Exemplary DAC Cell

In some embodiments, a current steering digital-to-analog converter (DAC) cell having randomized quad switching to reduce distortions can include quad switches and random or randomized quad switching logic.

The quad switches includes first, second, third, and fourth switches driven by first, second, third, and fourth signals respectively for steering a current to a first output or a second output of the current steering DAC cell depending on a driving code to the current steering DAC cell. Similar to other examples described herein, the four switches are all coupled to a current source at a same node (e.g., a common source node). Two switches are coupled to the first output, and two other switches are coupled to the second output.

The randomized quad switching logic generates the first and second signals which alternate turning on either the first switch or the second switch at a frequency hopping randomly between a predetermined frequency or twice of the predetermined frequency when the driving code is in a first state. The randomized quad switching logic also generates the third and fourth signals, which alternate turning on either the third switch or the fourth switch at a frequency hopping randomly between the predetermined frequency or twice of the predetermined frequency when the driving code is in a second state. The predetermined frequency can be the clock frequency $f_s$. The alternating normally occurs every half clock period (i.e., related to a frequency component of $2f_s$), but with random occurrence, the periodic alternating is skipped so that the selection does not alternate for a full clock period (or longer) (e.g., related to a frequency component of $f_s$). As a result, the glitches (including code-dependent distortions) can be modulated with a randomly hopping frequency between $f_s$ and $2f_s$. With the randomized quad switching scheme, the residual distortion that the traditional quad switching scheme was not able to completely remove due to impairments in switches and drivers can be randomized and appears more as a white-noise-like component spread over a wide frequency range.

In some embodiments, the first and the second signals periodically alternate selecting one of the first and the second switches to turn on and the other one of the first and the second switches to turn off when the driving code is in the first state after each half clock period (if swapping is not skipped). The first and second signals maintain states of the first and the second switches when the driving code is in the first state for a full clock period with random occurrence (when swapping is skipped). The third and the fourth signals periodically alternate selecting one of the third and the fourth switches to turn on and the other one of the third and the fourth switches to turn off when the driving code is in the second state after each half clock period (if swapping is not skipped). The third and fourth signals maintain states of the third and the fourth switches when the driving code is in the first state for a full clock period with random occurrence (when swapping is skipped).

The randomized quad switching logic randomly skips alternating, at twice of the predetermined frequency (with respect to how often the alternating normally occurs), turning on either the first or the second switch while the driving code is in the first state, and/or randomly skips alternating, at twice of the predetermined frequency (with respect to how often the alternating normally occurs), turning on either the third or the fourth switch while the driving code is in the second state.

The randomized quad switching logic can include (quad switching circuitry and) circuitry controlled by a random series for randomly swapping states of the first and the second signals to maintain the same selection of the first and the second switches with random occurrence, and/or circuitry controlled by a random series for randomly swapping states of the third and the fourth signals to maintain the same selection of the first and the second switches with random occurrence.

To further improve the performance of the DAC cell, the first and the second signals can randomly select one of the first and the second switches to turn on for a period immediately after the driving code changes from a second state to the first state. The third and the fourth signals can randomly select one of the third and the fourth switches to turn on for a period immediately after the driving code changes from the first state to the second state.

Variations and Implementations

The current steering DAC cell with randomized quad switching can be used as part of a DAC having an array of current steering DAC cells. Generally speaking, the DAC can include any number of current steering DAC cells. One or more ones of the current steering DAC cells can implement randomized quad switching. In some cases, some of the DAC cells may not implement randomized quad switching. For instance, some of the current steering DAC cells may implement the dual switching scheme or the traditional quad switching scheme, while one or more ones of the current steering DAC cells may implement randomized quad switching. The DAC, in some cases, can be a segmented DAC, which can include other DAC architectures where part of the DAC can be implemented with circuitry that does not involve current steering DAC cells.

Lastly, those whom are skilled in the art will appreciate that while examples herein have been described for a quad switching scheme with a P-type quad involving PMOS transistors, the randomized "swap skipping" operation can be easily extended to an N-type quad (where the tail current sinks $I_u$ to the ground and the switches are NMOS transistors), as well as to a complementary type architecture (where a P-type architecture in combination with an N-type architecture source and sink currents to a common pair of output nodes).

Note that the activities discussed above with reference to the FIGURES are applicable to any integrated circuits that involve digital-to-analog converters, in particular, current steering digital-to-analog converters. In certain contexts, the features discussed herein can be applicable to medical systems, radio frequency signal processing, intermediate frequency signal processing, baseband signal processing, wireless and wired communications, radar, industrial process control, audio and video equipment, video display, current sensing, instrumentation, industrial automation, programmable logic controllers, optical transceivers, data acquisition, optical communications, cable systems, ultra-wide bandwidth applications, electronic warfare, high end test and measurement equipment, signal synthesis, direct digital synthesis (DDS), and other applications.

In the discussions of the embodiments above, circuit components such as, clocks, drivers, switches, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. While the disclosure/claims describe the implementations using PMOS transistors (p-type metal-oxide semiconductor transistor(s)) devices, it is envisioned that complementary configurations using NMOS transistor(s) (n-type metal-oxide semiconductor transistor(s)) or equivalent bipolar-junction transistors (BJTs) can also be replace one or more of the PMOS transistor (or transistor devices) to provide the disclosed current steering DACs. It is understood by one skilled in the art that a transistor device can be generalized as a device having three (main) terminals. Furthermore, it is understood by one skilled in the art that a transistor device, during operation, can have a characteristic behavior of transistors corresponding to devices such as NMOS, PMOS, NPN BJT, PNP BJT devices (and any other equivalent transistor devices). For instance, the present disclosure/claims encompasses implementations where all PMOS devices are replaced by NMOS devices. The circuits using NMOS devices would be configured in an "upside-down" manner compared to the ones disclosed herein using NMOS devices. Varied implementations are equivalent to the disclosed implementations using PMOS transistors devices because the varied implementations would perform substantially the same function in substantially the same way to yield substantially the same result. Complementary or equivalent configurations (using BJTs in place of NMOS transistors) would be considered interchangeable with embodiments described herein using NMOS transistors to a person with ordinary skill in the art.

Parts of various apparatuses for randomized quad switching can include electronic circuitry to perform the functions described herein. In some cases, one or more parts of the apparatus can be provided by a processor or digital processing circuitry specially configured for carrying out the functions described herein, e.g., controlling or implementing randomization. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, receivers, transmitters, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the randomized quad switching functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to randomized quad switching illustrate only some of the possible functions that may be implemented or executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for randomized quad switching of a current steering digital-to-analog converter (DAC) cell, the method comprising:
    generating, based on a driving code, first, second, third, and fourth signals to drive first, second, third, and fourth transistors respectively, wherein the first and the second signals periodically alternate selection of the first or the second transistor to steer a current to a first output of the current steering DAC cell while the driving code is in a first state; and
    randomly skipping periodic alternating selection of the first and the second transistors by the first and the second signals while the driving code is in the first state.

2. The method of claim 1, wherein the first and second signals periodically alternate selection of the first or the second transistor every half clock cycle while the driving code is in the first state, and where periodic alternating selection is skipped during a full clock cycles.

3. The method of claim 1, wherein the first and second signals alternates turning one of the first and second transistors on and the other one of the first and the second transistors off every half clock cycle in response to the driving code being in the first state when random skipping of the periodic alternating selection is not occurring.

4. The method of claim 1, wherein randomly skipping periodic alternating selection comprises maintaining states of the first and second transistors for two or more consecutive periods while the driving code is in a first state.

5. The method of claim 1, further comprising:
    randomly selecting one of the first and the second transistors to turn on for a period immediately after the driving code changes from a second state to the first state.

6. The method of claim 1, further comprising:
randomly selecting one of the third and the fourth transistors to turn on for a period immediately after the driving code changes from the first state to a second state.

7. The method of claim 1, wherein:
the third and fourth signals periodically alternate selection of the third or the fourth transistor to steer the current to a second output of the current steering DAC cell while the driving code is in a second state; and
the method further comprises randomly skipping periodic alternating selection of the third and the fourth transistors by the third and the fourth signals while the driving code is in the second state.

8. A current steering digital-to-analog converter (DAC) cell having randomized quad switching to reduce distortions, comprising:
a current source for generating a current;
first, second, third, and fourth transistors driven by first, second, third, and fourth signals respectively for steering the current to a first output or a second output of the current steering DAC cell depending on a driving code to the current steering DAC cell;
quad switching logic to generate the first and the second signals which periodically alternate selecting one of the first and the second transistors to turn on and the other one of the first and the second transistors to turn off when the driving code is in a first state; and
a randomization block coupled to the quad switching logic to randomly maintain a same selection of the first and the second transistors for at least two consecutive periods when the driving code is in the first state.

9. The current steering DAC cell of claim 8, wherein the randomization block generates a random series of states to control whether (1) to alternate selecting one of the first and second transistors to turn on and the other one to turn off and (2) to randomly maintain the same selection.

10. The current steering DAC cell of claim 8, wherein the randomization block generates a random series of states to randomly select one of the first and the second transistors to turn on for a period immediately after the driving code changes from a second state to the first state.

11. The current steering DAC cell of claim 8, wherein the randomization block generates a random series of states to randomly select one of the third and the fourth transistors to turn on for a period immediately after the driving code changes from the first state to a second state.

12. The current steering DAC cell of claim 8, wherein the quad switching logic modulates code-dependent glitches at a node connecting the current source to the first, the second, the third, and the fourth transistors with a component having a randomly varying frequency between a predetermined frequency and twice of the predetermined frequency.

13. The current steering DAC cell of claim 8, wherein the quad switching logic further comprises:
circuitry controlled by the randomization block for randomly swapping states of the first and the second signals to randomly maintain the same selection of the first and the second transistors.

14. A current steering digital-to-analog converter (DAC) cell having randomized quad switching to reduce distortions, comprising:
first, second, third, and fourth switches driven by first, second, third, and fourth signals respectively for steering a current to a first output or a second output of the current steering DAC cell depending on a driving code to the current steering DAC cell; and
randomized quad switching logic to generate the first and second signals which alternate turning on either the first switch or the second switch at a frequency hopping randomly between a predetermined frequency or twice of the predetermined frequency when the driving code is in a first state.

15. The current steering DAC cell of claim 14, wherein:
the first and the second signals periodically alternate selecting one of the first and the second switches to turn on and the other one of the first and the second switches to turn off when the driving code is in the first state after each half clock period; and
the first and second signals maintain states of the first and the second switches when the driving code is in the first state for a full clock period with random occurrence.

16. The current steering DAC cell of claim 14, wherein the randomized quad switching logic randomly skips alternating, at twice of the predetermined frequency, turning on either the first or the second switch while the driving code is in the first state.

17. The current steering DAC cell of claim 14, wherein the randomized quad switching logic comprises:
circuitry controlled by a random series for randomly swapping states of the first and the second signals to maintain the same selection of the first and the second switches with random occurrence.

18. The current steering DAC cell of claim 14, wherein the first and the second signals randomly select one of the first and the second switches to turn on for a period immediately after the driving code changes from a second state to the first state.

19. The current steering DAC cell of claim 14, wherein the third and the fourth signals randomly select one of the third and the fourth switches to turn on for a period immediately after the driving code changes from the first state to a second state.

20. The current steering DAC cell of claim 14, wherein the randomized quad switching logic generates the third and fourth signals, which alternate turning on either the third switch or the fourth switch at a frequency hopping randomly between the predetermined frequency or twice of the predetermined frequency when the driving code is in a second state.

* * * * *